United States Patent [19]

Matsumoto et al.

[11] Patent Number: 5,222,016
[45] Date of Patent: Jun. 22, 1993

[54] FREQUENCY CONVERTER

[75] Inventors: Susumu Matsumoto; Masaru Hashimoto, both of Yokohama, Japan

[73] Assignee: Kabushiki Kaisha Toshiba, Kanagawa, Japan

[21] Appl. No.: 688,611

[22] PCT Filed: Oct. 8, 1990

[86] PCT No.: PCT/JP90/01302
§ 371 Date: Jul. 29, 1991
§ 102(e) Date: Jul. 29, 1991

[30] Foreign Application Priority Data
Oct. 11, 1989 [JP] Japan .................. 1-262868

[51] Int. Cl.⁵ .................. H02M 5/00; H04B 1/26
[52] U.S. Cl. .................. 363/157; 455/326; 330/262; 332/117; 332/141
[58] Field of Search .................. 363/157, 164, 165; 455/296, 298, 308, 310, 311, 313, 317, 318, 323, 326, 333; 330/259, 260, 262, 270, 271, 291, 293; 332/117, 126, 141

[56] References Cited
U.S. PATENT DOCUMENTS
4,695,940 9/1987 Rein .................. 363/157
4,910,801 3/1990 Anzini et al. .................. 455/326

FOREIGN PATENT DOCUMENTS
59-19413 1/1984 Japan .
61-33516 2/1986 Japan .
61-264904 11/1986 Japan .

Primary Examiner—Emanuel T. Voeltz
Attorney, Agent, or Firm—Finnegan, Henderson, Farabow, Garrett & Dunner

[57] ABSTRACT

According to this invention, a frequency converter comprises a frequency mixer (11) formed in a semiconductor integrated circuit (10), an impedance conversion/signal amplitude limit differential amplifier (12) formed in the semiconductor integrated circuit and connected to the output of the frequency mixer, a first frequency mixing output terminal (14) connected to an output terminal of the frequency mixer and serving as an external terminal of the semiconductor integrated circuit, and a second frequency mixing output terminal (15) connected to an output terminal of the differential amplifier and serving as an external terminal of the semiconductor integrated circuit.

8 Claims, 3 Drawing Sheets

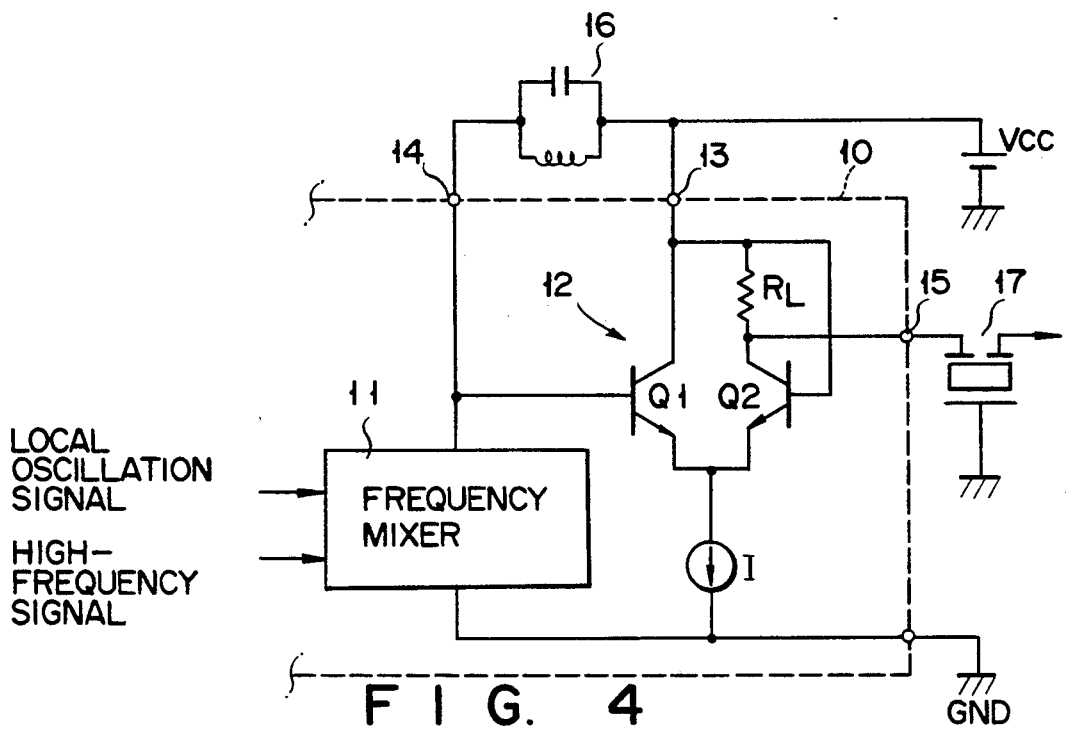
F I G. 4
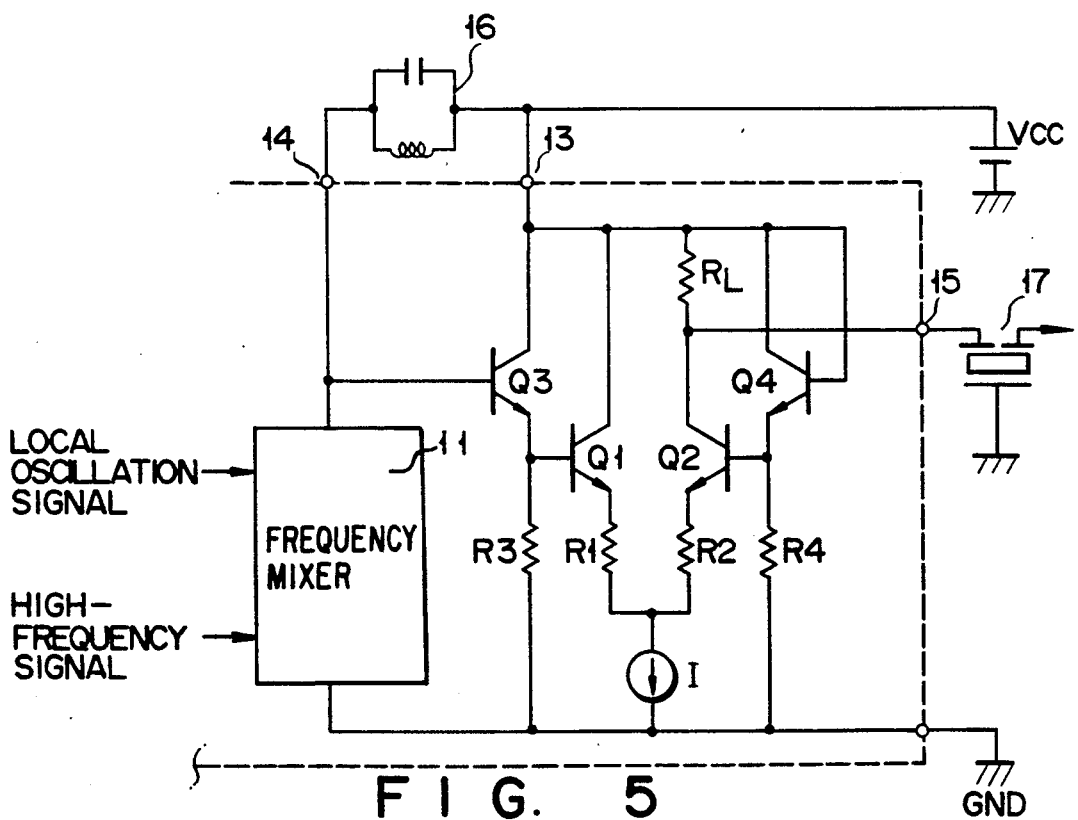
F I G. 5

FREQUENCY CONVERTER

TECHNICAL FIELD

The present invention relates to a frequency converter used for converting, e.g., an FM reception signal of an FM receiver into an intermediate-frequency signal.

BACKGROUND ART

Conventionally, a frequency converter used for converting, e.g., an FM reception signal of an FM receiver into an intermediate-frequency signal, is arranged as shown in FIGS. 1 to 3.

In a circuit in FIG. 1, reference numeral 31 denotes a frequency mixer for mixing an FM reception signal (high-frequency signal) and a local oscillation signal. The mixer 31 is formed in a bipolar integrated circuit, 30. Reference numeral 32 denotes an intermediate-frequency transformer for extracting an intermediate-frequency component of 10.7 MHz from an output of the frequency mixer 31. The transformer 32 is connected between a Vcc power source terminal 34 and a frequency mixing output terminal 35 outside the integrated circuit 35. Reference numeral 33 denotes a ceramic filter (center frequency is 10.7 MHz), for obtaining desired selectivity, connected to the secondary coil of the intermediate-frequency transformer 32.

The frequency mixer 31 comprises a first npn transistor Q11 the base of which receives an FM reception signal (high-frequency signal) input, a second npn transistor Q12 the base of which receives a DC bias potential, a resistor R connected between the emitters of the npn transistors Q11 and Q12, a first current source Ia connected between the emitter of the first npn transistor Q11 and a ground potential GND, a second current source Ib connected between the emitter of the npn transistor Q12 and the GND, a third npn transistor Q13 the collector-emitter path of which is connected between the Vcc power source terminal 34 and the first npn transistor Q11, a fourth npn transistor Q14 the collector-emitter path of which is connected between the Vcc power source terminal 34 and the second npn transistor Q12, a fifth npn transistor Q15 the emitter of which is connected to the emitter of the third npn transistor Q13, the base of which is connected to the base of the fourth npn transistor Q14, and the collector of which is connected to the frequency mixing output terminal 35, and a sixth npn transistor Q16 the emitter of which is connected to the emitter of the fourth npn transistor 14, the base of which is connected to the base of the third npn transistor Q13, and the collector of which is connected to the frequency mixing output terminal 35. Local oscillation signal inputs are applied between the bases of the third and fifth npn transistors Q13 and Q15 and between the bases of the sixth and fourth npn transistors 16 and 14.

In the circuit in FIG. 1, in order to match the secondary coil of the intermediate-frequency transformer 32 with the impedance of the ceramic filter 33, a turn ratio of the secondary coil to the primary coil of the intermediate-frequency transformer 32 must be decreased. Therefore, a large intermediate-frequency conversion gain is difficult to obtain.

On the other hand, in a circuit shown in FIG. 2, a frequency mixer 41, an impedance converting emitter follower 42 connected to the output of the frequency mixer 41, and a resistor 43 one terminal of which is connected to the output of the emitter follower 42 are arranged in a bipolar integrated circuit 40. Reference numeral 44 denotes a Vcc power source terminal; 45, a first frequency mixing output terminal connected to the output terminal of the frequency mixing circuit 41; and 46, a second frequency mixing output terminal connected to the other terminal of the resistor 43. Reference numeral 47 denotes an intermediate-frequency tuner consisting of an LC tuner for tuning an intermediate-frequency component of 10.7 MHz of the output from the frequency mixer 41. The tuner 47 is connected between the Vcc power source terminal 44 and the first frequency mixing output terminal 45 outside the integrated circuit 40. Reference numeral 48 denotes a ceramic filter, for obtaining desired selectivity, connected to the second frequency mixing output terminal 46 outside the integrated circuit 40.

In the circuit in FIG. 2, since impedance matching between an output impedance of the frequency mixing circuit 41 and the ceramic filter 48 is performed by the emitter follower 42, a large intermediate-frequency conversion gain can be obtained. However, since the emitter follower 42 has no signal amplitude limiting function, an intermediate-frequency signal at a level higher than a desired level is supplied to an intermediate-frequency amplifier (not shown) connected to the output of the ceramic filter 48.

In a the circuit shown in FIG. 3, a frequency mixer 51, a resistor 52 connected to the load and output of the frequency mixer 51, and an intermediate-frequency limiter 53 are arranged in a bipolar integrated circuit 50. Reference numeral 54 denotes a Vcc power source terminal, and reference numeral 55 denotes a frequency mixing output terminal connected to the output terminal of the intermediate-frequency limiter 53. Reference numeral 56 denotes a ceramic filter, for obtaining desired selectivity, connected to the frequency mixing output terminal 55 outside the integrated circuit 50.

In the circuit in FIG. 3, a signal amplitude limiting function of the intermediate-frequency limiter 53 can prevent supply of an intermediate-frequency signal having a level higher than a necessary level to the sequential intermediate-frequency amplifier. However, since an intermediate-frequency transformer or an intermediate-frequency tuner is not connected to the load of the frequency mixer 51, an unnecessary frequency component except for an intermediate-frequency signal generated by the frequency mixer 51 cannot be suppressed, thereby degrading spurious features of the circuit.

As described above, in a conventional frequency converter, when an intermediate signal is extracted from an output of a frequency mixer through the intermediate-frequency transformer, a large intermediate-frequency conversion gain is difficult to obtain. When the intermediate-frequency signal is extracted from the output of the frequency mixer through an emitter follower, an intermediate-frequency signal having a level higher than a necessary level is supplied to the intermediate-frequency amplifier connected to the following stage. As a result, when the intermediate-frequency signal is extracted from the output of the frequency mixer through an intermediate-frequency limiter, spurious features of the circuit are degraded.

The present invention has been made to solve the above problem, and has as its object to provide a frequency converter in which a large intermediate-frequency conversion gain can be obtained, supply of an intermediate-frequency signal having a level higher than a necessary level to a sequential intermediate-frequency amplifier can be prevented, a signal of an unnecessary frequency component except for an intermediate-frequency signal generated by the frequency mixer can be sufficiently suppressed, and which is free from the degradation of spurious features.

Disclosure of Invention

According to the present invention, there is provided a frequency converter comprising a frequency mixer formed on a semiconductor integrated circuit and an impedance conversion/signal amplitude limit differential amplifier connected to an output of the frequency mixer, wherein an output terminal of the frequency mixer and an output of the differential amplifier are connected to first and second frequency mixing output terminals serving as external terminals of the semiconductor integrated circuit, respectively.

With the above arrangement, since impedance matching between an output impedance of the frequency mixer and that of a intermediate-frequency filter can be performed by the impedance conversion/signal amplitude limit differential circuit, a large intermediate-frequency conversion gain can be obtained, and supplying of an intermediate-frequency signal having a level higher than a necessary level to a sequential intermediate-frequency amplifier can be prevented.

In addition, since an intermediate-frequency tuner, is connected to the load of the frequency mixer, the unnecessary frequency component signal, except for an intermediate-frequency signal generated by the frequency mixer, can be sufficiently suppressed, and spurious features of the circuit are not degraded.

BRIEF DESCRIPTION OF DRAWINGS

FIG. 4 is a circuit diagram showing a frequency converter according to an embodiment of the present invention, and FIG. 5 is a circuit diagram showing a frequency converter according to a modification of the embodiment in FIG. 4.

BEST MODE OF CARRYING OUT THE INVENTION

Figure 1:
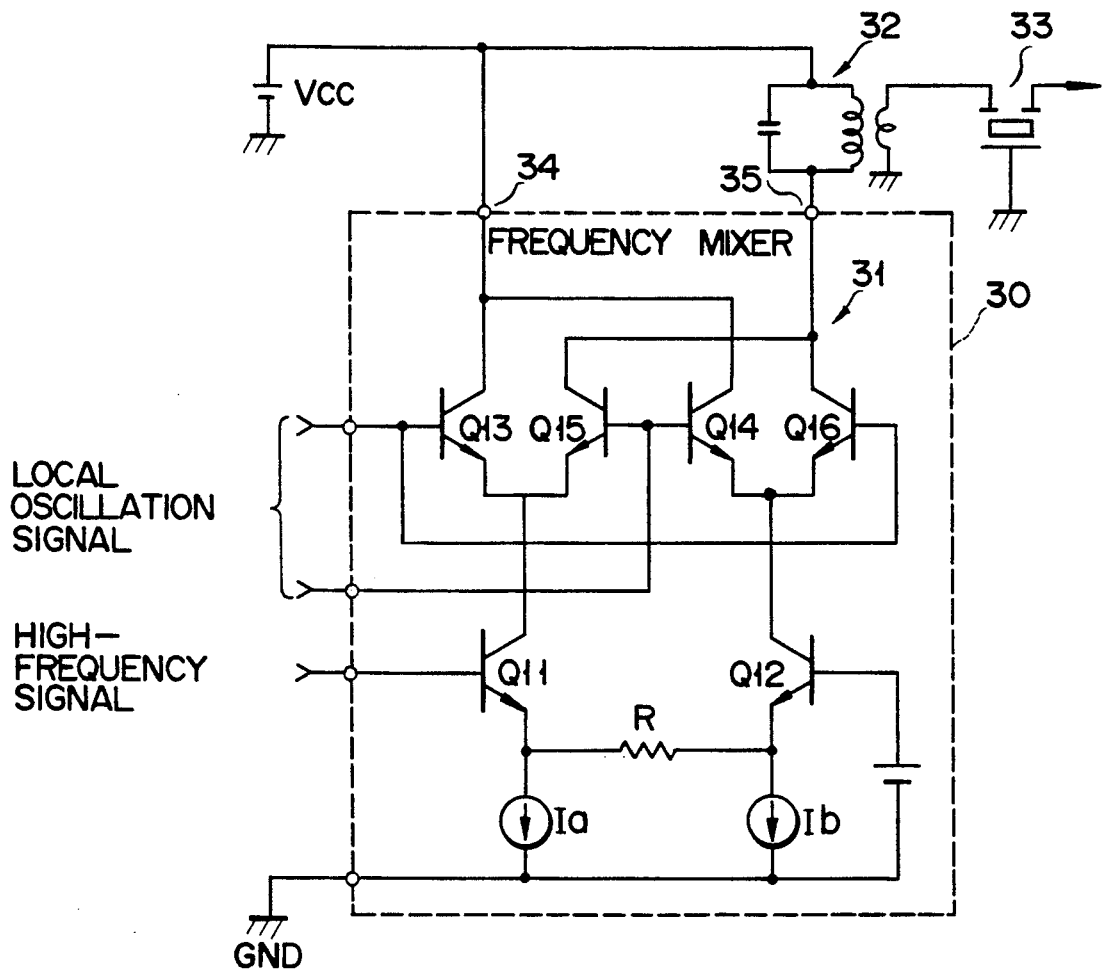
FIGS. 1 to 3 are circuit diagrams showing a conventional frequency converter.

An embodiment of the present invention will be described below with reference to the accompanying drawings.

FIG. 4 shows a frequency converter used for converting an FM reception signal into an intermediate-frequency signal in, e.g., an FM receiver. More specifically, reference numeral 11 denotes a frequency mixer for mixing the FM reception signal (high-frequency signal) and a local oscillation signal, and reference numeral 12 denotes an impedance conversion/signal amplitude limit differential amplifier connected to the output of the frequency mixer 11. The frequency mixer 11 and the differential amplifier 12 are formed in a bipolar integrated circuit 10. Reference numeral 13 denotes a Vcc power source terminal; 14, a first frequency mixing output terminal connected to the output terminal of the frequency mixer 11; and reference numeral 15, a second frequency mixing output terminal connected to the output terminal of the differential amplifier 12. The Vcc power source terminal 13 and first and second frequency mixing output terminals 14 and 15 are external terminals of the integrated circuit 10. Reference numeral 16 denotes an intermediate-frequency tuner consisting of an LC tuner (L is a coil, and C is a capacitor) for tuning an intermediate-frequency component of 10.7 MHz of the output from the frequency mixer 11. The tuner 16 is connected between the Vcc power source terminal 13 and the first frequency mixing output terminal 14 outside the integrated circuit 10. Reference numeral 17 denotes an intermediate-frequency filter, e.g., a ceramic filter (a center frequency is 10.7 MHz), for obtaining desired selectivity, connected to the second frequency mixing output terminal 15 outside the integrated circuit 10. An intermediate-frequency amplifier (not shown) is connected to the next stage of the ceramic filter 17.

The arrangement of the frequency mixer 11 is identical to that of the frequency mixer 31 shown in FIG. 1. The differential amplifier 12 comprises a first npn transistor Q1 the base of which is connected to the output terminal of the frequency mixer 11 in a DC manner, a second npn transistor Q2 the emitter of which is connected to the emitter of the first npn transistor Q1 in a DC manner and the base of which is connected to the Vcc power source terminal 13, and a current source I connected between a DC connection point of the emitters of the first and second npn transistors Q1 and Q2 and a ground potential GND. The differential amplifier 12 is arranged so as to extract a frequency mixing output from at least one collector of the first and second npn transistors Q1 and Q2. In this embodiment, the collector of the first npn transistor Q1 is connected to the Vcc power source terminal 13, a load resistor $R_L$ is connected between the collector of the second npn transistor Q2 and the Vcc power source terminal 13, and the collector of the transistor Q2 is connected to a second frequency mixing output terminal 15.

Although DC base potential of the second npn transistor Q2 is almost equal to the DC base potential (a Vcc potential is applied through the coil L of the LC tuner 16) of the first npn transistor Q1, the AC base potential of the second npn transistor Q2 is grounded. The resistance of the load resistor $R_L$ is set to be almost equal to the input resistance of the ceramic filter 17.

In a frequency converter, since impedance matching between the frequency mixer 11 and the ceramic filter 17 connected to the next stage is performed by the impedance conversion/signal amplitude limit differential amplifier 12, a large intermediate-frequency conversion gain can be obtained, supply of an intermediate-frequency signal having a level higher than a necessary level to the intermediate-frequency amplifier connected to the following stage can be prevented. In this case, the gain of the differential amplifier 12 is determined by a current value of the current source I, thereby setting the intermediate-frequency conversion gain.

Since an intermediate tuner 16 is connected to the load of the frequency mixer 11, a signal of an unnecessary frequency component except for an intermediate-frequency signal generated by the frequency mixer 11 can be sufficiently suppressed. Therefore, the spurious features of the circuit are not degraded.

Figure 2:
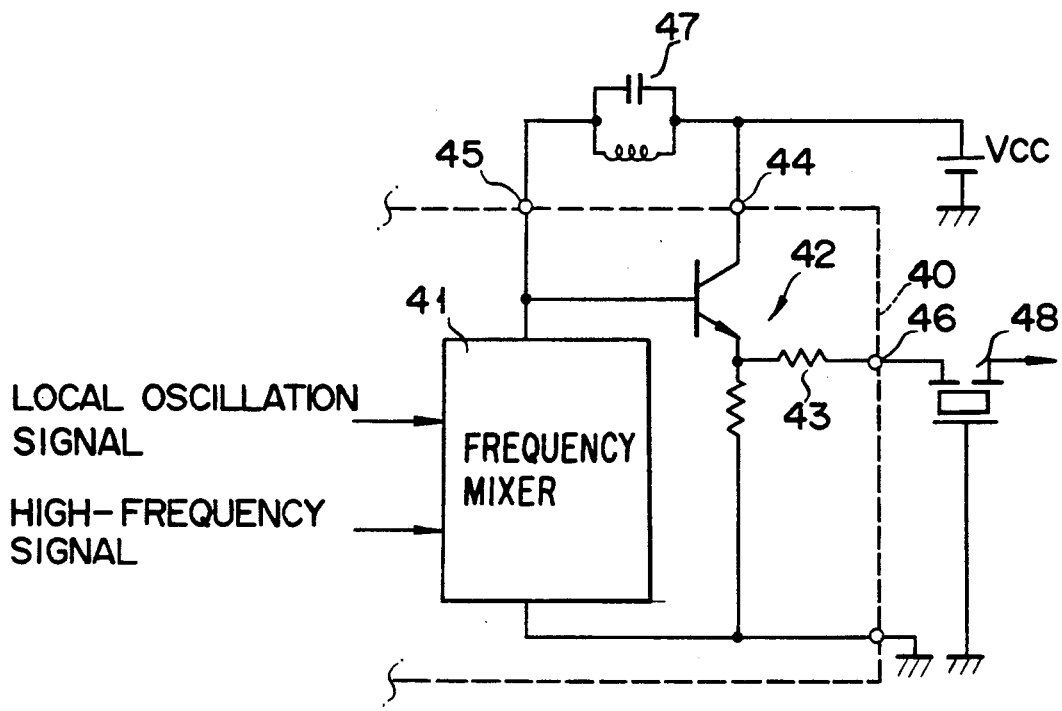
Figure 3:
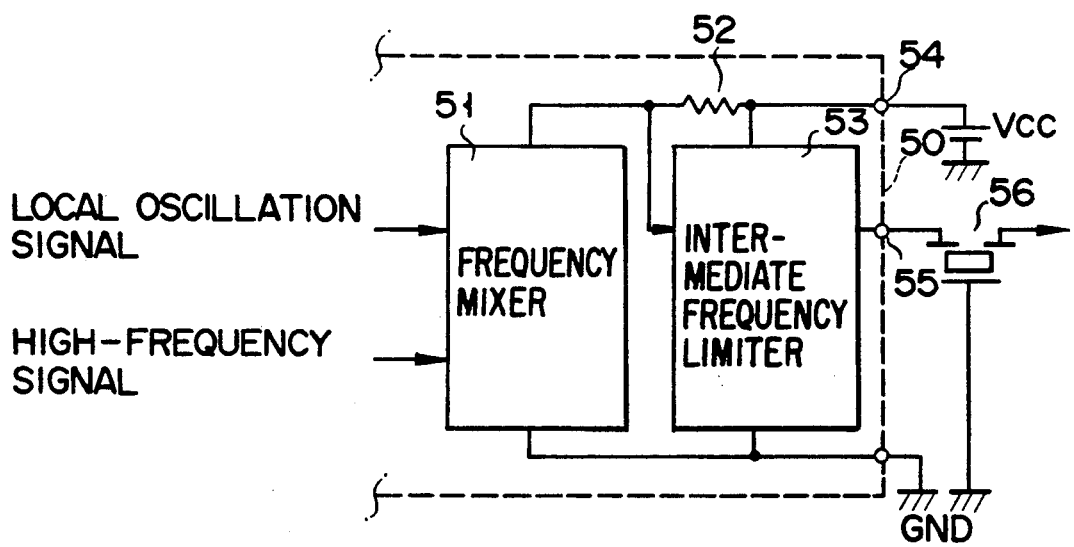

The number of frequency mixing output terminals 14 and 15 of the integrated circuit 10 is larger than that of the conventional circuits in FIGS. 1 and 3 by one, but is equal to that of the conventional circuit in FIG. 2.

FIG. 5 shows a modification of the frequency converter in FIG. 4. In FIG. 5, in order to change the gain of the differential amplifier 12, resistors R1 and R2 are connected to the emitters of the first and second npn transistors Q1 and Q2, respectively, to increase the input impedance of the differential amplifier 12. In order to increase the dynamic range of the differential amplifier 12, a first emitter follower consisting of a third npn transistor Q3 and a resistor R3 is connected to the input of the first npn transistor Q1, and a second emitter follower consisting of a fourth npn transistor Q4 and a resistor 4 is connected to the input of the second npn transistor Q2.

According to the frequency converter in FIG. 5, the same effect as in the frequency converter in FIG. 4 can be obtained. The characteristics of the frequency converter are improved, and an intermediate-frequency conversion gain can be easily set.

INDUSTRIAL APPLICABILITY

As described above, according to the frequency converter of the present invention, since impedance matching between the output impedance of a frequency mixer and that of an intermediate-frequency filter connected to a next stage is performed by a differential amplifier connected to the output of the frequency mixer, a large intermediate-frequency conversion gain can be obtained, and supply of an intermediate-frequency signal having a level higher than a necessary level to an intermediate-frequency amplifier connected to a following stage can be prevented. Since an intermediate-frequency tuner is connected to the load of the frequency mixer, a signal of an unnecessary frequency component except for an intermediate-frequency signal generated by the frequency mixer can be sufficiently suppressed, and the spurious features of the circuit are not degraded. Therefore, the frequency converter can be effectively applied to an FM receiver or the like.

We claim:

1. A frequency converter comprising:
   a frequency mixer for mixing a high-frequency signal with a local oscillation signal, and for outputting a signal consisting of a plurality of signal components;
   a tuner for tuning only a signal component having a constant frequency among signals output from said frequency mixer; and
   a differential amplifier providing an output terminal and having
   a first bipolar transistor wherein said tuned signal component is input to a base, and a collector is connected to a first power source terminal,
   a second bipolar transistor wherein a bas is connected to said first power source terminal, the emitter is connected to the emitter of said first bipolar transistor, and a collector is connected to the output terminal;
   a current source for connecting the second power source terminal to a connection point between an emitter of said first bipolar transistor and an emitter of said second bipolar transistor, and
   a resistor connected between said first power source and the collector of said second bipolar transistor.

2. A frequency converter according to claim 1, wherein said frequency mixer and said differential amplifier are incorporated as an integrated circuit version inside a semiconductor substrate, and said tuner is separate from said semiconductor substrate.

3. A frequency converter according to claim 1, wherein said tuner consists of a circuit having a coil and a capacitor connected in parallel.

4. A frequency converter according to claim 1, wherein an intermediate-frequency filter is connected to said output terminal.

5. A frequency converter characterized by comprising:
   a frequency mixer for mixing a high-frequency signal with a local oscillation signal, and for outputting a signal consisting of a plurality of signal components;
   a tuner for tuning only a signal component having a constant frequency among output signals of said frequency mixer, and
   a differential amplifier providing an output terminal and having
   a first bipolar transistor wherein said tuned signal component is input to a base, and a collector is connected to a first power source,
   a second bipolar transistor wherein a base is connected to an emitter of said first bipolar transistor, and a collector is connected to said first power source terminal,
   a third bipolar transistor wherein a base and a collector are connected to said first power source terminal,
   a fourth bipolar transistor wherein a base is connected to an emitter of said third bipolar transistor, and a collector is connected to the output terminal,
   a first resistor connected between the emitter of said first bipolar transistor and a second power source terminal,
   a second resistor connected between an emitter of said second bipolar transistor and a current source,
   a third resistor connected between an emitter of said third bipolar transistor and said second power source terminal,
   a fourth resistor connected between an emitter of said fourth bipolar transistor and said current source, and
   a fifth resistor connected between said first power source terminal and the collector of said fourth bipolar transistor.

6. A frequency converter according to claim 5, wherein said frequency mixer and said differential amplifier comprise an integrated circuit in a semiconductor substrate, and said tuner is separate from said semiconductor substrate.

7. A frequency converter according to claim 5, wherein said tuner consists of a circuit having a coil and a capacitor connected in parallel.

8. A frequency converter according to claim 5, wherein an intermediate-frequency filter is connected to said output terminal.

* * * * *